United States Patent
Mandelman et al.

(10) Patent No.: US 6,555,862 B1
(45) Date of Patent: Apr. 29, 2003

(54) SELF-ALIGNED BURIED STRAP FOR VERTICAL TRANSISTORS

(75) Inventors: Jack A. Mandelman, Stormville, NY (US); Ulrike Gruening, Wappingers Falls, NY (US); Alexander Michaelis, Wappingers Falls, NY (US)

(73) Assignees: Infineon Technologies AG, Munich (DE); International Business Machines Corp., Armonk, NY (US)

( * ) Notice: Subject to any disclaimer, the term of this patent is extended or adjusted under 35 U.S.C. 154(b) by 0 days.

(21) Appl. No.: 09/670,745

(22) Filed: Sep. 27, 2000

Related U.S. Application Data

(62) Division of application No. 09/329,705, filed on Jun. 10, 1999, now abandoned.

(51) Int. Cl.⁷ .................... H01L 27/108; H01L 29/76; H01L 29/94
(52) U.S. Cl. .................... 257/301; 257/302; 257/304
(58) Field of Search .................... 257/301, 302, 257/304, 296

(56) References Cited

U.S. PATENT DOCUMENTS 5,519,236 A * 5/1996 Ozaki .................... 257/302

* cited by examiner

*Primary Examiner*—Steven Loke

(57) ABSTRACT

A semiconductor device formed by a method for aligning a strap diffusion, in accordance with the invention, includes the steps of providing a trench in a substrate, the trench having a storage node formed therein including a buried strap on top of the storage node, and depositing a dopant rich material on the buried strap. A trench top dielectric is formed on the dopant rich material, and portions of the dopant rich material are removed above the trench top dielectric. Dopants are outdiffused from the dopant rich material into an adjacent region of the substrate to form the strap diffusion by forming a gate in an upper portion of the trench such that the strap diffusion is operatively disposed relative to the gate.

10 Claims, 8 Drawing Sheets

SELF-ALIGNED BURIED STRAP FOR VERTICAL TRANSISTORS

This is a divisional, of application Ser. No. 09329,705 filed Jun. 10, 1999, now abandoned.

BACKGROUND

1. Technical Field

This disclosure relates to semiconductor fabrication and more particularly, to a structure and method for self-aligning a buried strap diffusion to a gate conductor edge of a vertical transistor for semiconductor memories.

2. Description of the Related Art

Since the scalability of planar transistors (such as, metal oxide semiconductor field effect transistors or MOSFETs) in trench storage memory devices is severely limited, memory cells have looked toward utilization of vertical transistors. Vertical transistors are promising candidates for scalability, especially below minimum feature sizes of 100nm. This is due in part to the vertical channel length for the vertical transistors being decoupled from the minimum design ground rule. However, as with all new technologies, opportunities exist for improving the structure and process integration of these cells.

Referring to FIG. 1, one area for improvement concerns the properties of a buried-strap outdiffusion 12 between a trench capacitor 14 and a vertical transistor 16. The buried-strap outdiffusion 12 should be limited to avoid back-to-back device interaction where buried-strap outdiffusions face each other in adjacent cells (See FIG. 1). The distance between back-to-back strap outdiffusion is characterized by a parameter Xs in FIG. 1. For a given cell design and set of design groundrules, it is desired to maximize Xs. This means that the strap outdiffusion 12 into a deep trench 18 (DT) sidewall should be minimized. This is indicated by a parameter BSODx as shown in FIG. 1.

It also should be assured that the overlap (Dovl) between the strap-outdiffusion 12 and a gate 20 of the vertical transistor 16 be sufficient to prevent the formation of "bumps" in the electric potential of the channel of the transistor 16. These potential "bumps" impede the channel current and degrade the electrical behavior of the transistor 16. It is to be assured that the edge of the strap outdiffusion (or strap diffusion) 12 be at least coincident with the edge of a gate conductor 22 in a worst case scenario. To meet this requirement, the thickness of the TTO (trench top oxide) 24, shown as parameter Ttto, should be sufficiently thin. However, if the TTO 22 is too thin the incidence of wordline to node shorts may be excessive. Modeling has shown that, for the currently practiced process, the maximum value of Ttto is limited by the diffusion to gate overlap requirement to approximately 30 nm. It may be necessary to use a thicker TTO for adequate reliability in conventional systems.

Therefore, a need exists for providing a strap diffusion for a vertical transistor in a trench storage cell which decouples the lateral outdiffusion (BSODx) from the diffusion to gate overlap (Dovl) and from the thickness of the TTO (Ttto).

SUMMARY OF THE INVENTION

A method for aligning a strap diffusion, in accordance with the invention, includes the steps of providing a trench in a substrate, the trench having a storage node formed therein including a buried strap on top of the storage node, and depositing a dopant rich material on the buried strap. A trench top dielectric is formed on the dopant rich material, and portions of the dopant rich material are removed above the trench top dielectric. Dopants are outdiffused from the dopant rich material into an adjacent region of the substrate to form the strap diffusion by forming a gate in an upper portion of the trench such that the strap diffusion is operatively disposed relative to the gate.

Another method for aligning a strap diffusion includes the steps of providing a trench in a substrate, the trench having a storage node formed therein including a buried strap on top of the storage node, depositing a dopant rich material on the buried strap, depositing a dielectric layer on the dopant rich material, forming a trench top dielectric on the dielectric layer, removing portions of the dopant rich material and the dielectric layer above the trench top dielectric and outdiffusing dopants from the dopant rich material into an adjacent region of the substrate to form the strap diffusion by forming a gate in an upper portion of the trench such that the strap diffusion is operatively disposed relative to the gate. The dielectric material may include a nitride having a thickness of between about 3 nm and about 15 nm.

In alternate methods, the dopant rich material preferably includes arsenic silicate glass (ASG), phosphorus silicate glass (PSG), or other insulating layer including these or other dopants, such as antimony. The step of depositing a dopant rich material on the buried strap may include the step of depositing the dopant rich material with a thickness of between about 5 nm and about 20 nm. The step of outdiffusing dopants may further include the step of forming a sacrificial oxide and a gate dielectric for forming the gate such that the dopants outdiffuse during processing. The dopant rich material and the trench top dielectric may form a top surface within the trench, the method may further include the step of forming a dielectric cap on the trench top dielectric and the dopant rich material at the top surface in the trench. The dielectric cap preferably includes a nitride. The trench may be include a trench storage capacitor or a buried bitline conductor in a cell using a stacked capacitor storage element.

A semiconductor device, in accordance with the present invention, includes a substrate having a trench therein. The trench has a storage node formed therein including a buried strap on top of the storage node. A dopant rich material is formed on the buried strap, and a trench top dielectric is formed on the dopant rich material. A strap diffusion is formed by outdiffusion of dopants from the dopant rich material into an adjacent region of the substrate. The adjacent region of the substrate is operatively disposed relative to a gate conductor formed in an upper portion of the trench.

In alternate embodiments, a dielectric cap layer may be formed on the trench top dielectric for preventing dopants from the dopant rich material from autodoping sidewalls of the trench. The dielectric cap layer preferably includes a nitride. The dopant rich material may include arsenic, phosphorous and/or antimony dopants. The dopant rich material may include a thickness of between about 5 nm and about 20 nm. The trench may be employed for a trench capacitor or a buried bit line. A nitride liner may be disposed between the dopant rich material and the trench top dielectric for blocking dopants from entering the trench top dielectric.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

Figure 1:
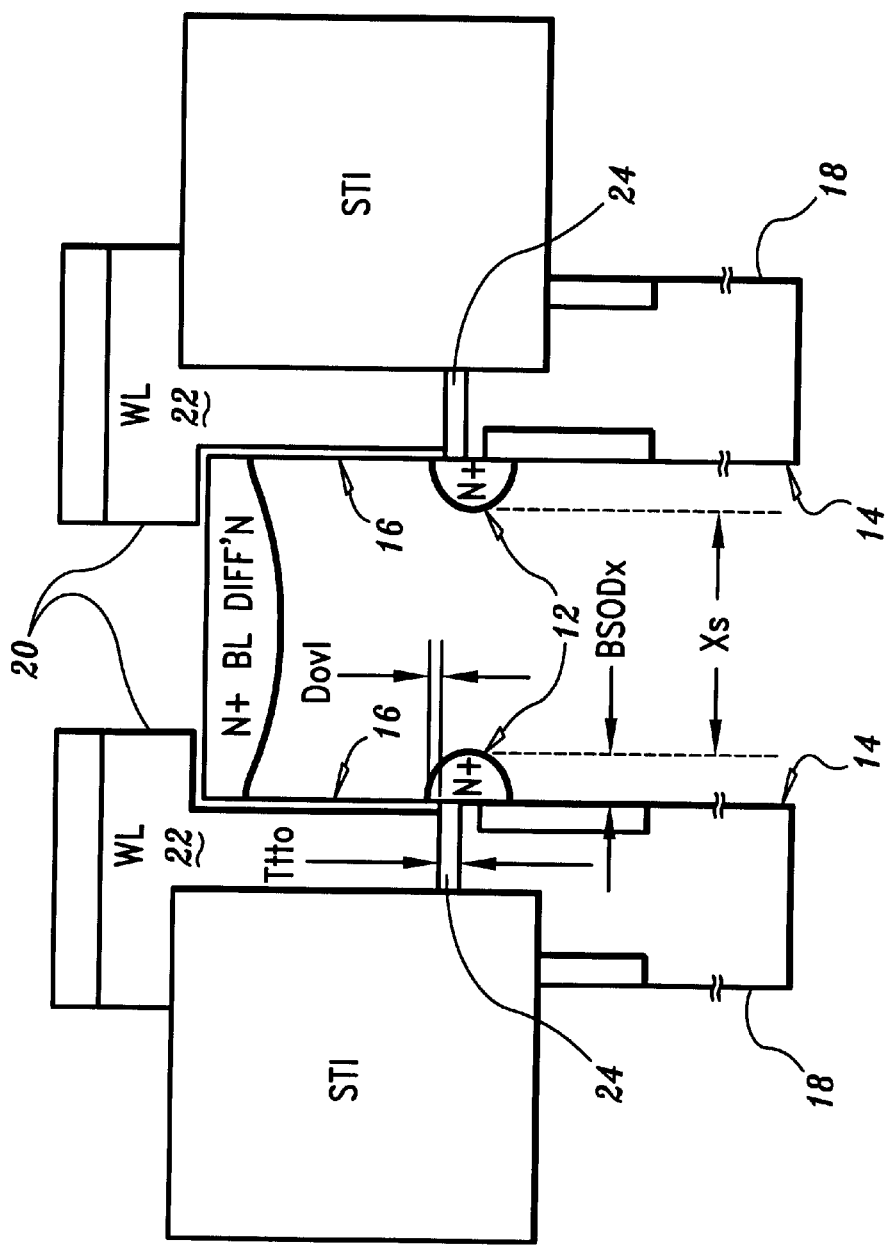
FIG. 1 is a cross-sectional view of portions of two memory cells showing important parameters for alignment of strap diffusions in accordance with the prior art.

The present invention provides a structure and fabrication method for forming a strap outdiffusion in which the parameters BSODx, Dovl and Ttto as shown in FIG. 1 are independently adjustable. This invention advantageously provides a structure and method of fabrication for concurrently meeting the requirements of 1) an adequately thick trench top oxide (TTO) to assure reliability, 2) a sufficient gate to strap-diffusion overlap to assure good device characteristics, and 3) a controlled strap outdiffusion from strap poly to single crystal interface (of a substrate) to assure minimal back-to-back device interaction.

A method and structure for one embodiment of the invention is described by in FIGS. 2 through 10. Referring now in specific detail to the drawings in which like reference numerals identify similar or identical elements throughout the several views, and initially to FIG. 2, a deep trench capacitor structure is shown for a memory cell of a semiconductor memory chip 100. A deep trench 102 is formed in a substrate 104 by conventional processes known to those skilled in the art for the formation of vertical transistor trench memory cells. As is known in the art, a pad stack 101 is formed and patterned, deep trenches 102 are etched and a buried plate diffusion is formed about a lower portion of trench 102. A collar 106 is formed by LOCOS or by deposition and preferably includes an oxide. A node dielectric 108 is then deposited to line trench 104. Trench 104 is filled with N+ poly to form a storage node 110, planarized and recessed to the desired depth to form a strap diffusion (in later steps). An exposed portion of the collar 106 is etched and recessed to the desired depth of the strap diffusion. The exposed portion of collar 106 is etched and recessed beneath the top surface of the N+ poly. A layer of poly is deposited and isotopically etched such that poly is left in the divot and forms a buried strap 112. The end result of this conventional processing is illustrated in the FIG. 2.

Figure 3:
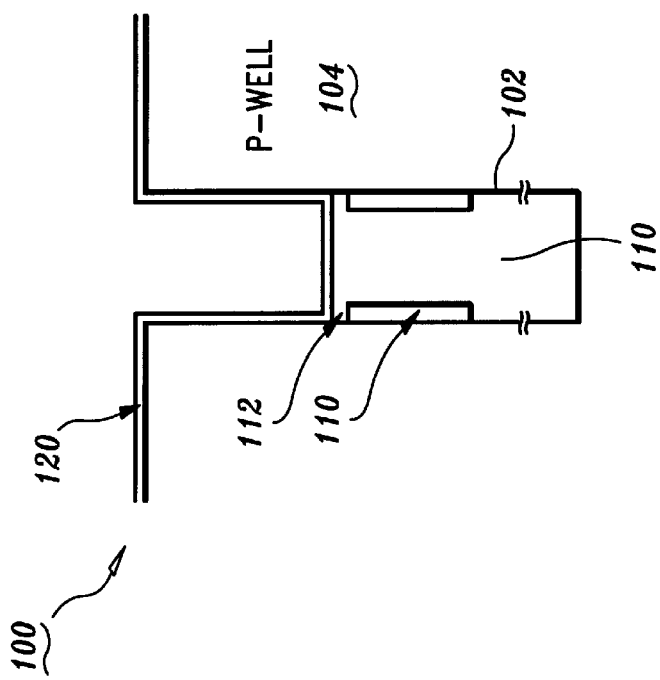
FIG. 3 is a cross-sectional view showing a dopant rich material deposited on the structure of FIG. 2 in accordance with the present invention.
Figure 2:
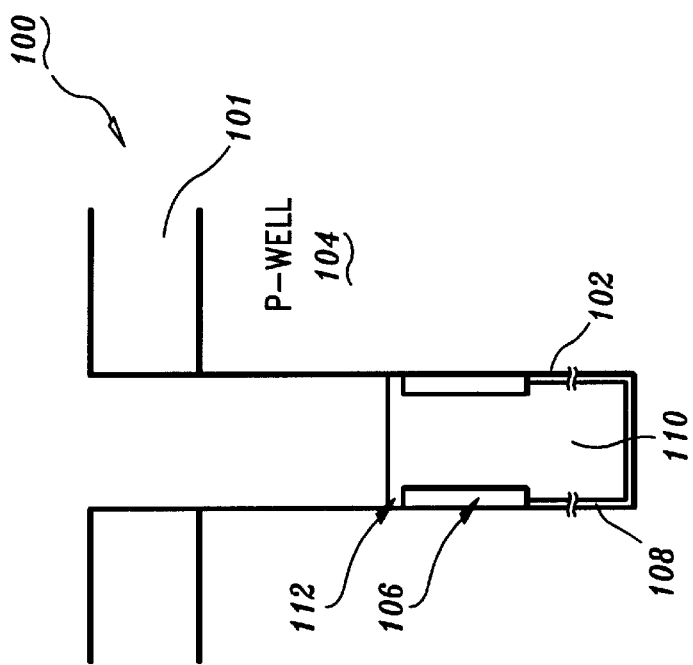
FIG. 2 is a cross-sectional view of a trench structure employed for a deep trench capacitor.

Referring to FIG. 3, pad stack 101 is removed and a thin layer 120 of a dopant rich material is deposited. Layer 120 may include a thickness of between about 5 nm and about 20 nm. Layer 120 may be deposited by a chemical vapor deposition (CVD) process or by a physical vapor deposition (PVD) process. Layer 120 is substantially conformally deposited such that a thickness within the preferred range of about 5–20 nm is achieved on sidewalls of the trench to provide a dopant source for a portion of a buried strap diffusion. In one embodiment, the concentration of dopants in the dopant rich material of layer 120 is preferably from about $1 \times 10^{18}$ to about $5 \times 10^{19}$ cm$^{-3}$. In some embodiments, dopant rich material of layer 120 includes the deposition of a doped glass by the decomposition of TEOS or by a high temperature reaction of $SiCl_2H_2$ and $N_2O$. Depending on the desired deposition rate, the deposition of layer 120 may be conducted from about 375 EC and about 800 EC. Layer 120 is a dielectric layer. Layer 120 may include dopants, such as arsenic, phosphorous and/or antimony. These dopants may be included in for example a silicate glass. In a preferred embodiment, the dopant rich material of layer 120 includes arsenic silicate glass.

Figure 4:
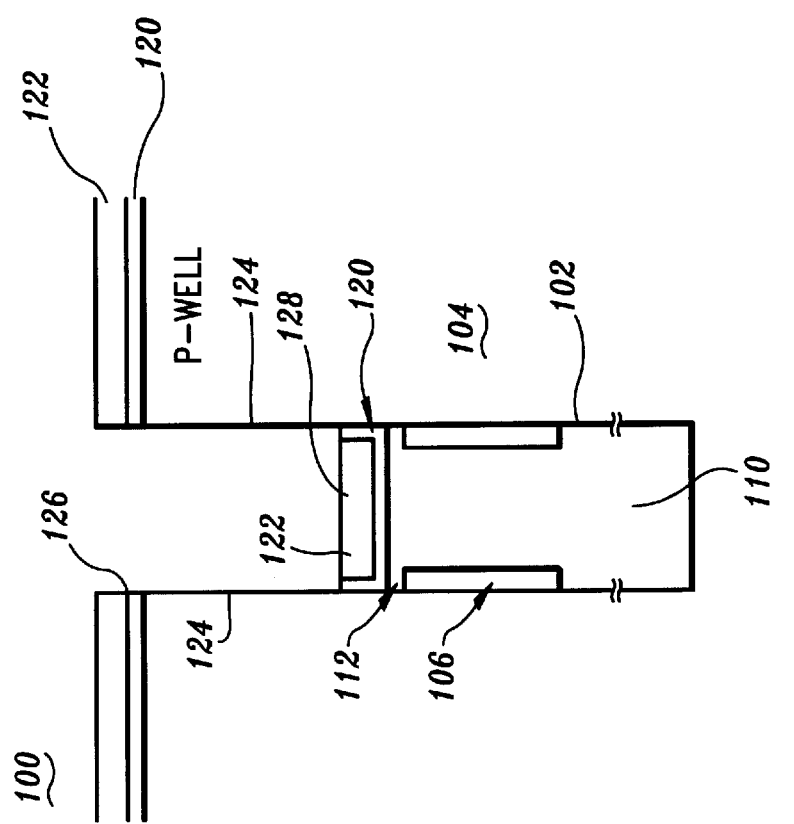
FIG. 4 is a cross-sectional view showing a trench top dielectric formed on the structure of FIG. 3 in accordance with the present invention.

Referring to FIG. 4, a dielectric layer 122 is predominantly deposited on the horizontal surfaces of chip 100, including the interior of trench 102. In a preferred embodiment, layer 122 includes a silicon oxide, and is preferably formed by a high density plasma (HDP) process. This HDP process forms an oxide in a columnar manner such that horizontal are covered while vertical surfaces are generally not. Vertical surfaces may include the oxide and this may be removed by an etch process. Layer 122 is formed with a thickness of between about 25 nm and about 50 nm as measured from a top surface 126. An isotropic etch is performed to remove any residual HDP oxide (while leaving sufficient thickness on the horizontal surfaces) and to remove layer 120 from sidewalls 124. The etch is continued until all of layer 120 is removed from sidewalls 124. In the course of the isotropic etch of HDP oxide and layer 120, a portion of layer 122 is also consumed. However, since layer 122 is deposited sufficiently thick, a desired thickness remains after layer 120 is removed. A portion remaining in trench 102 becomes a trench top dielectric 128 (or trench top oxide—TTO, if an oxide is used). Trench top dielectric 128 may have a thickness greater than 30 nm.

Figure 5:
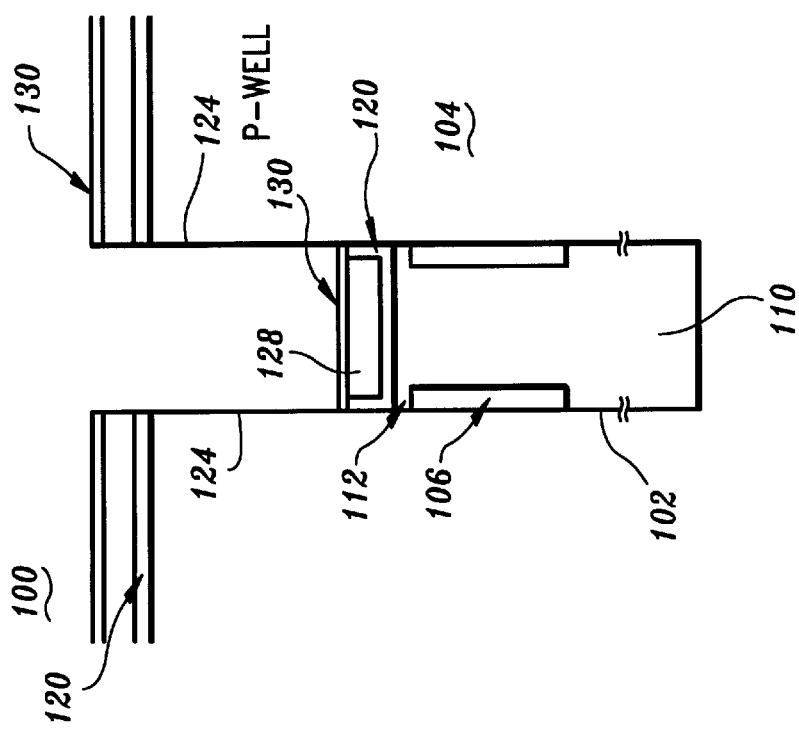
FIG. 5 is a cross-sectional view showing a dielectric cap layer formed on the structure of FIG. 4 in accordance with the present invention.

Referring to FIG. 5, if autodoping from remaining portions of layer 120 into unprotected sidewalls 124 is a concern during subsequent processing, such as sacrificial and gate oxidations, an additional layer 130 may optionally be formed. Layer 130 may include a nitride, such as a polysilicon nitride which is preferably formed by a high density plasma silicon nitride deposition process (i.e. HDP nitride). Layer 130 is formed on the horizontal surface of trench top dielectric 128 by HDP deposition and isotropic etching (to expose the silicon of sidewalls 124).

Figure 6:
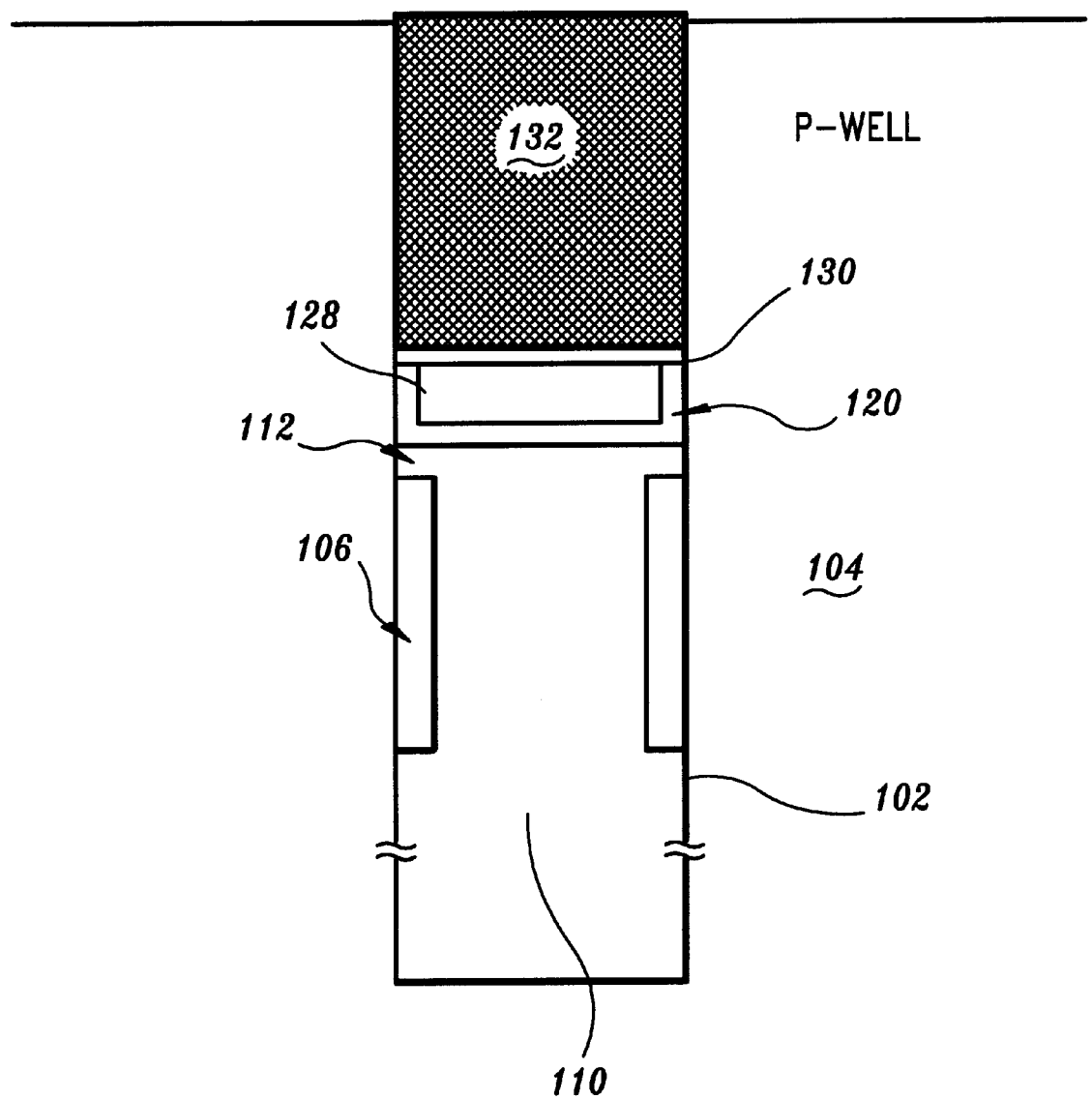
FIG. 6 is a cross-sectional view showing a resist formed in the structure of FIG. 5 for removing layers from a horizontal top surface in accordance with the present invention.

Referring to FIG. 6, a resist 132 is formed in trench 102. Resist 132 is used to protect trench top dielectric 128, layer 130 and layer 120 in trench 102 while these layers are removed from the top horizontal surfaces.

Figure 7:
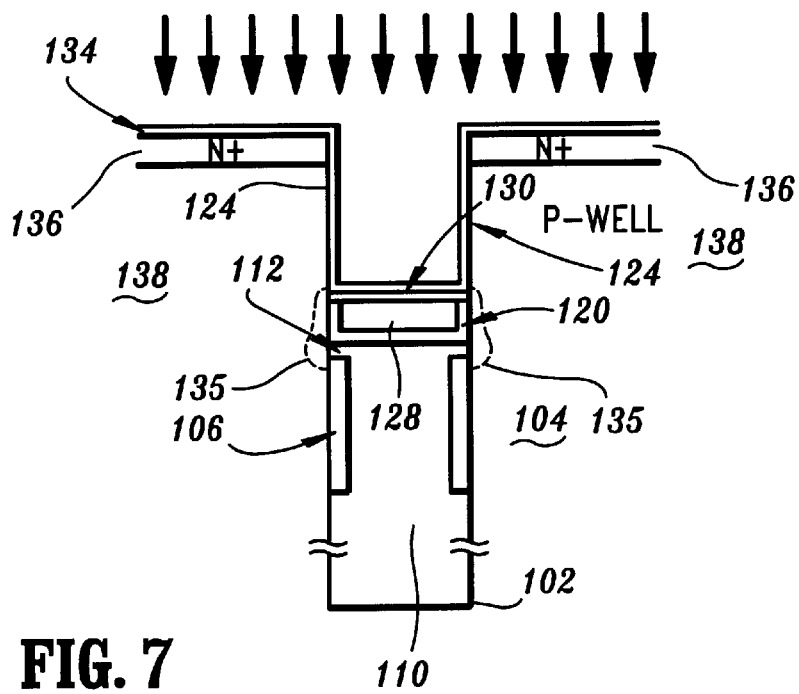
FIG. 7 is a cross-sectional view showing implantation and an initial formation of strap diffusions on the structure of FIG. 6 in accordance with the present invention.

Referring to FIG. 7, resist 132 is removed, and a sacrificial oxide (sac ox) 134 is formed on the top horizontal surfaces, on sidewalls 124 and possibly on trench top dielectric 128. Array bit line diffusion regions 136 are implanted with dopants (preferably N+ dopants, although other dopants may be used depending of the design). During the formation of the sacrificial oxide, dopants from the dopant rich material of layer 120 begin to outdiffuse into a P-well 138 of substrate 104. These dopants are from the polysilicon of storage node 110 and buried strap 112 and layer 120. This marks the onset of the formation of a strap diffusion 135 in accordance with the present invention.

Figure 8:
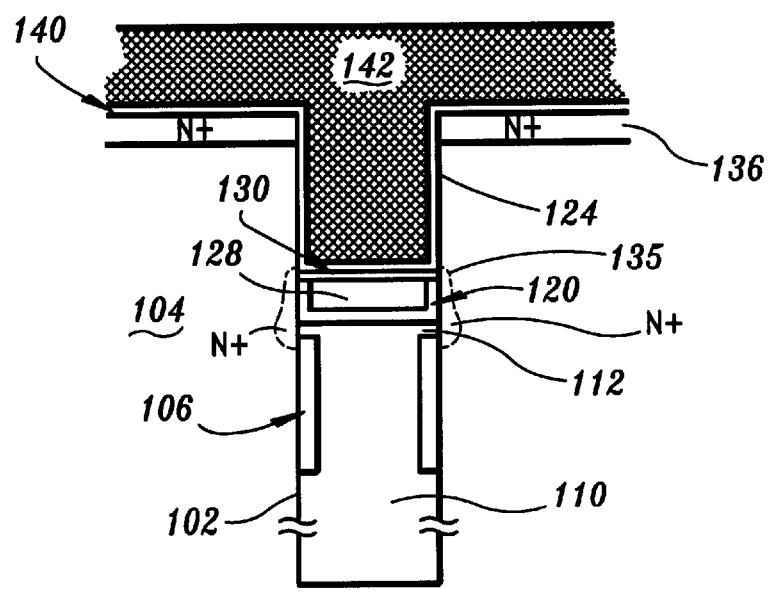
FIG. 8 is a cross-sectional view showing a gate conductor formed on the structure of FIG. 7 in accordance with the present invention.

Referring to FIG. 8, sac ox 134 is stripped and a gate dielectric 140 is formed. Gate dielectric 140 is preferably formed by heating up chip 100 in the presence of oxygen to from an oxide on exposed surfaces of substrate 104 and trench top dielectric 128 or layer 130. During this process strap diffusion 135 expands in accordance with the present invention. A gate conductor 142 is now deposited. Gate conductor 142 is formed in trench 102 and on horizontal surfaces of chip 10. Gate conductor 142 preferably includes polysilicon, and more preferably doped polysilicon.

Figure 9:
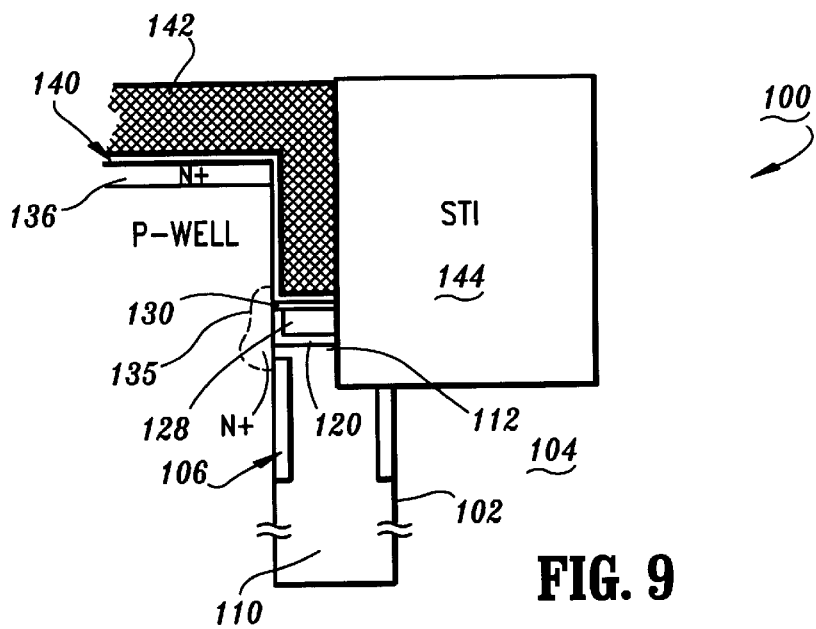
FIG. 9 is a cross-sectional view showing an active area etch and a shallow trench isolation structure formed on the structure of FIG. 8 in accordance with the present invention.
Figure 10:
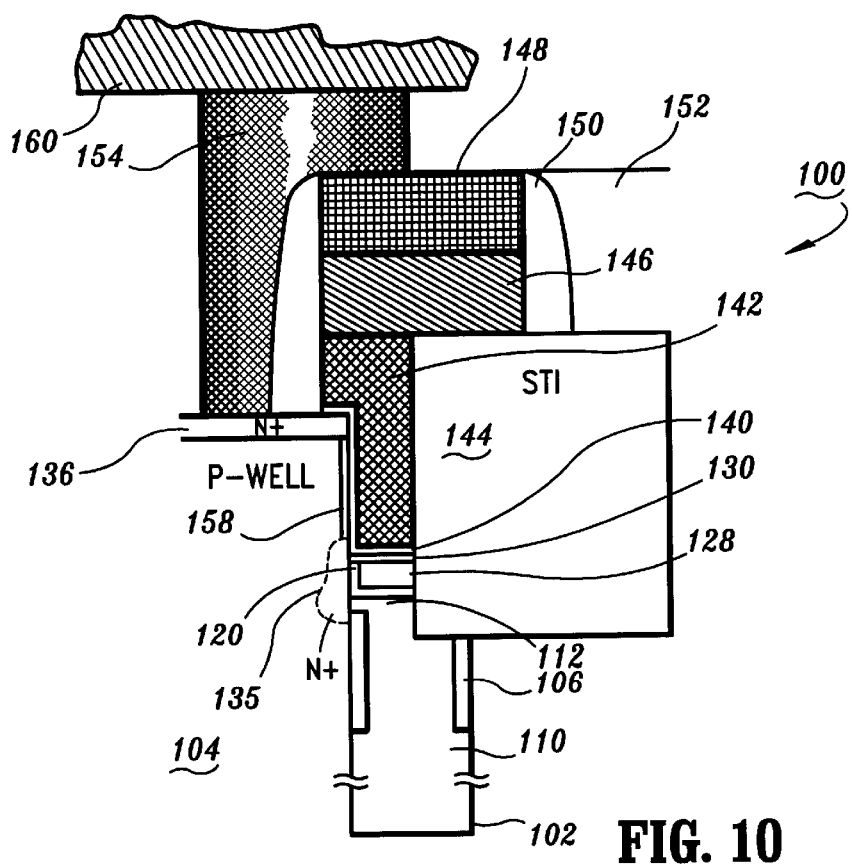
FIG. 10 is a cross-sectional view showing a completed trench capacitor memory cell in accordance with the present invention.

Referring to FIGS. 9 and 10, active areas are patterned, isolation trenches etched, filled and planarized to form shallow trench isolation regions 144. Normal processing resumes, which includes the formation of wordline conductors 146 which may include a metal silicide or other highly conductive material. A nitride cap 148, and sidewall-spacers 150 are formed. Implantation of sources and drains (not shown) may be performed if necessary. A dielectric layer 152, which may include boron silicate glass (BSG), is deposited and planarized. A bitline contact 154 is also formed. Further processing continues as is known in the art.

A vertical transistor memory cell is fabricated in accordance with the present invention. When gate conductor 142 is activated a channel 158 is formed in a portion of substrate 104 adjacent to gate conductor 142, and a conductive path now exists between a bit line 160 to storage node 110.

In accordance with the invention, a dopant rich layer 120 is formed which is positioned between a buried strap and a trench top dielectric. When processing occurs such as sac ox or gate dielectric formation, dopants diffuse into an area of the substrate adjacent to the dopant rich materials. Advantageously, the strap diffusion formed is self-aligned or positioned to provide improved vertical transistor operation. The strap diffusion in accordance with the present invention avoids back-to-back device interaction where buried-strap outdiffusions face each other in adjacent cells (See FIG. 1) by permitting the minimization of the BSODx dimension. The present invention assures that the overlap (Dovl) between the edge of the strap diffusion is at least coincident with the edge of a gate conductor. In fact this is easily exceeded by the present invention, and it is not dependant on the thickness of the trench top dielectric. In other words, the trench top dielectric may be as thick as needed, thus shorts between wordline to node shorts are reduced. The maximum value of the trench top dielectric is not limited to 30 nm for the present invention.

Figure 11:
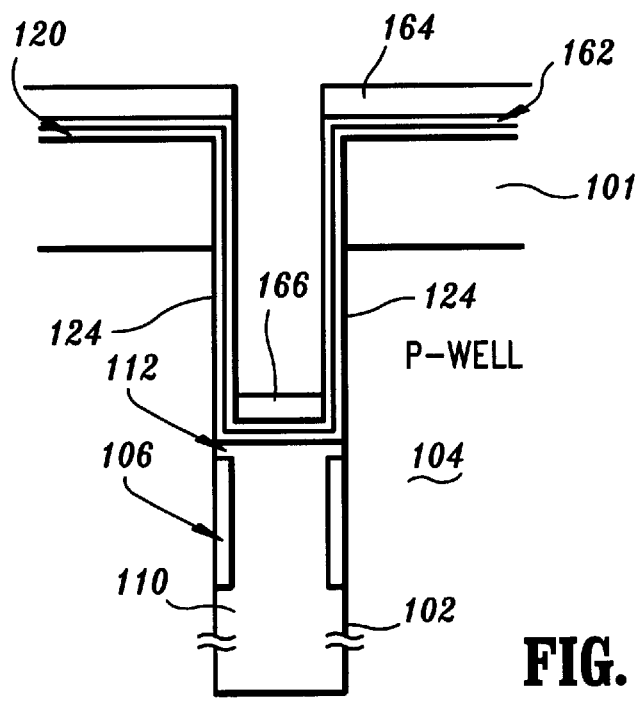
FIG. 11 is a cross-sectional view of another embodiment of the present invention showing a dielectric layer formed between a trench top dielectric and a dopant rich material in accordance with the present invention.

Referring to FIG. 11, another embodiment of the present invention is shown. Following poly etchback for buried strap 112, layer 120 is formed followed by a capping dielectric layer 162 preferably formed from silicon-nitride (SiN) or other material which enables selective removal relative to materials deposited below or above dielectric layer 162. Dielectric layer 162 includes a thickness of between about 3 nm and about 15 nm if SiN is employed.

A dielectric layer 164 is deposited for forming a trench top dielectric 166. Trench top dielectric 166 is preferably formed by HDP oxide deposition followed by etching back dielectric layer 164 to remove HDP oxide from sidewalls as described above. Dielectric layer 164 is preferably an oxide such as a deposited oxide, and more preferably a high density plasma oxide. In this way, dielectric layer 164 is removed selective to dielectric layer 162. Dielectric layer 162 is employed to prevent autodoping from the portion of layer 120 remaining during subsequent high temperature steps from contaminating sidewalls 124 of trench 102. Further, dielectric layer 162 also prevents doping of trench top dielectric 166 resulting in an improvement in the reliability of trench top dielectric 166.

Figure 12:
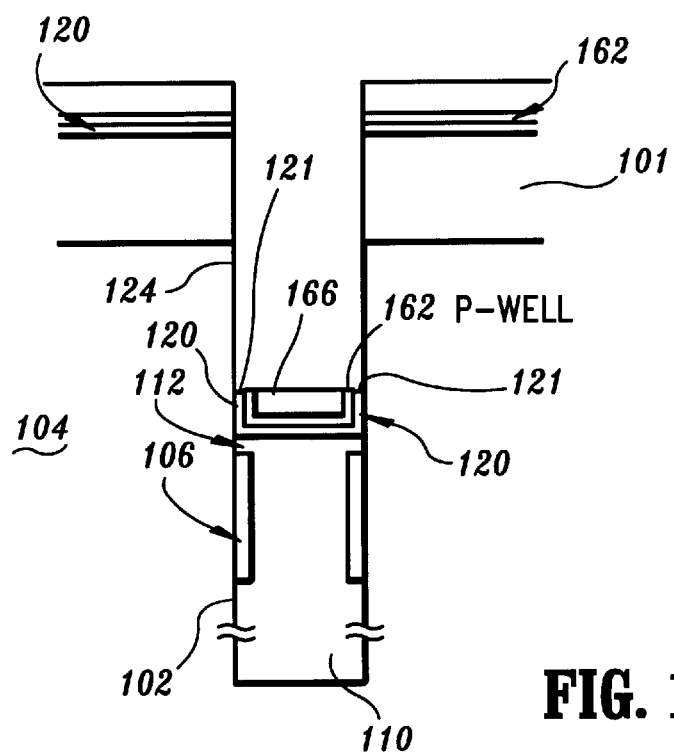
FIG. 12 is a cross-sectional view of the embodiment of FIG. 11 showing the dielectric layer and the dopant rich material recessed in accordance with the present invention.

Referring to FIG. 12, the exposed portions layer 162 on trench sidewalls 124 is removed preferably with an isotropic etch. Layer 120 is also removed from sidewalls 124 (this also forms a divot 121 in layer 120). A resist planarization and recess is then used to mask the interior of trench 102 while layer 164, layer 162, layer 120, and pad stack 101 are removed from the top horizontal surfaces.

A sacrificial oxide is grown and then the wells and bitline diffusions are implanted. Processing as described by FIGS. 8–10 follows. During the sacrificial oxidation, divot 121 formed in layer 120 is sealed, preventing the escape of dopants from layer 120 into trench 102. In one embodiment, a dielectric layer 162 may also be employed as described above.

Figure 13:
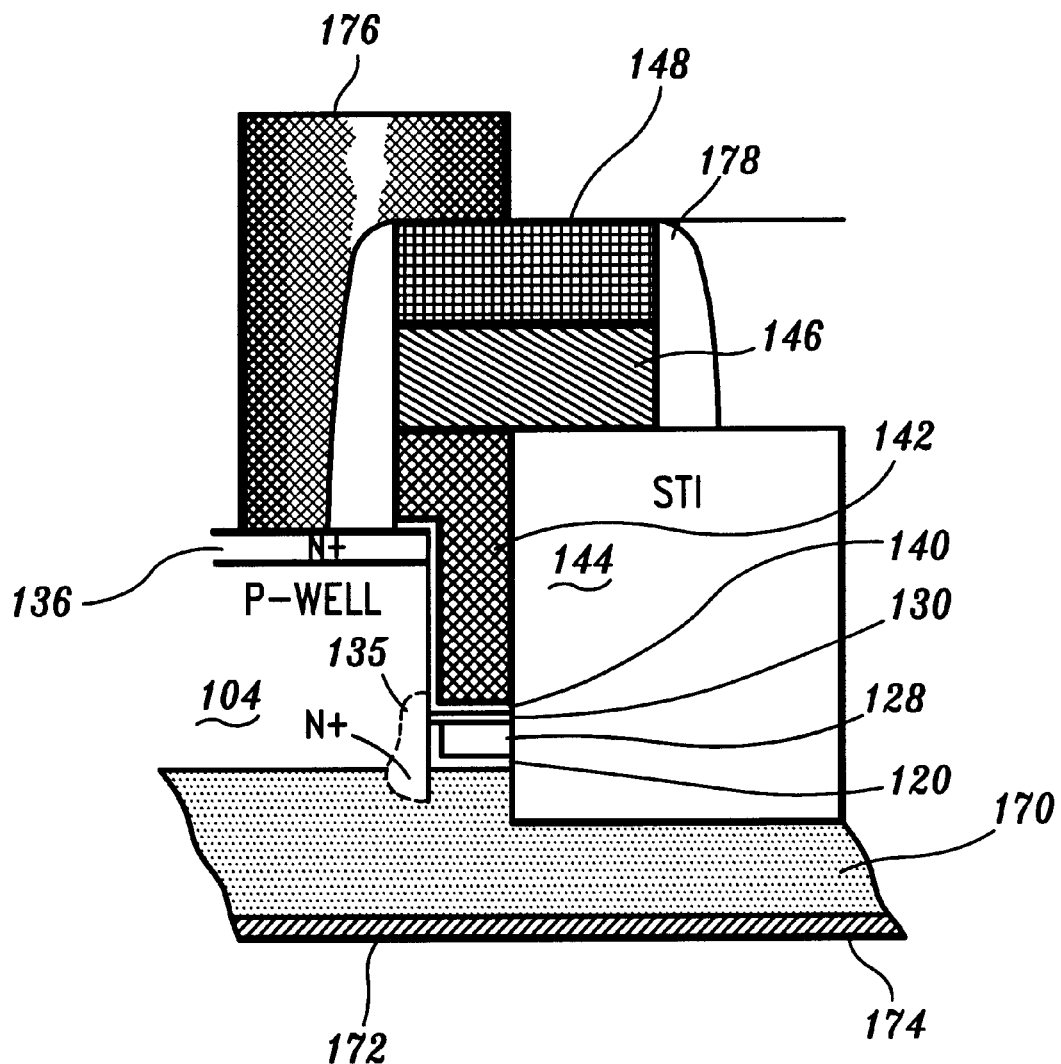
FIG. 13 is a cross-sectional view showing a stacked capacitor memory cell employing the present invention.

Referring to FIG. 13, a strap self aligned to a wordline edge, in accordance with the present invention, is also of value in stack capacitor type memory cells. A bitline conductor 170 lies in a trench 172 that is shallower than the deep trenches of a trench storage memory device. Bitline conductor 170 may be formed, for example, from heavily doped polysilicon of from a composite of polysilicon and a silicide, or from some other suitable conductive material. A thick insulating layer 174 (preferably oxide) surrounds the bitline conductor, to minimize bitline capacitance. A capacitor contact 176 is formed to contact an overlying stack capacitor (not shown).

The cross-section of the wordline (gate) is shown clearly to depict capacitor contact 176 and a sidewall spacer 178. The wordline runs orthogonally to the buried-bitline.

It is to be understood that the same methods described above to form diffusions which are self-aligned to the edge of a gate conductor may be applied to vertical transistors in general, and are not limited to memory devices, such as dynamic random access memories, but may be employed in any semiconductor device. Furthermore, this technique may be used to form Lightly Doped Drains (LDD) diffusions in vertical transistors. In preferred embodiments the vertical. transistors are metal oxide semiconductor field effect transistors (MOSFETs).

Structures and methods for forming strap diffusions which are self-aligned to the edge of the gate conductor in vertical transistors, such as MOSFETs, have been described in accordance with the present invention. The present invention provides for the fabrication of a strap outdiffusion with greater control and provides 1) an adequately thick trench top oxide (TTO) to assure reliability, 2) a sufficient gate to strap-diffusion overlap to assure good device characteristics, and 3) a controlled strap outdiffusion from strap poly to single crystal interface (of a substrate) to assure minimal back-to-back device interaction. The strap outdiffusion is self-aligned to the gate conductor of the vertical transistor.

Having described preferred embodiments for self-aligned buried strap for vertical transistors (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device comprising:
   a substrate including a trench therein, the trench having a storage node formed therein including a buried strap on top of the storage node;
   a layer of dopant rich material formed on the buried strap;
   a trench top dielectric formed on the layer of dopant rich material, wherein a portion of the layer of dopant rich material is disposed between the substrate and a vertical side portion of the trench top dielectric that is adjacent to the substrate, wherein said vertical side portion of the trench top dielectric is in direct contact with a side portion of the dopant rich materials; and
   a strap diffusion formed by outdiffusion of dopants from the layer of dopant rich material into an adjacent region of the substrate, the adjacent region of the substrate being operatively disposed relative to a gate conductor formed in an upper portion of the trench.

2. The semiconductor device as recited in claim 1, wherein the dopant rich material includes arsenic silicate glass.

3. The semiconductor device as recited in claim 1, wherein the dopant rich material includes a thickness of between about 5 nm and about 20 nm.

4. The semiconductor device as recited in claim 1, wherein the trench is employed for a trench capacitor.

5. A semiconductor device comprising:
   a substrate including a trench therein, the trench having a buried bitline formed therein;
   a layer of dopant rich material formed on the buried bitline;
   a trench top dielectric formed on the layer of dopant rich material, wherein a portion of the layer of dopant rich material is disposed between the substrate and a side portion of the trench top dielectric that is adjacent to the substrate; and
   a strap diffusion formed by outdiffusion of dopants from the dopant rich material into an adjacent region of the substrate, the adjacent region of the substrate being operatively disposed relative to a gate conductor formed in an upper portion of the trench.

6. The semiconductor device as recited in claim 5, wherein the dopant rich material includes arsenic silicate glass.

7. The semiconductor device as recited in claim 5, wherein the dopant rich material includes a thickness of between about 5 nm and about 20 nm.

8. A semiconductor device comprising:
   a substrate including a trench therein, the trench having a storage node formed therein including a buried strap on top of the storage node;
   a dopant rich material formed on the buried strap;
   a trench top dielectric formed on the dopant rich material;
   a strap diffusion formed by outdiffusion of dopants from the dopant rich material into an adjacent region of the substrate, the adjacent region of the substrate being operatively disposed relative to a gate conductor formed in an upper portion of the trench; and
   a nitride liner disposed between the layer of dopant rich material and the trench top dielectric for blocking dopants from entering the trench top dielectric.

9. The semiconductor device as recited in claims 8, wherein the dopant rich material includes arsenic silicate glass.

10. The semiconductor device as recited in claim 8, wherein the layer of dopant rich material includes a thickness of between about 5 nm and about 20 nm.

* * * * *